United States Patent
Chandra

(10) Patent No.: US 7,508,330 B1
(45) Date of Paten: Mar. 24, 2009

(54) APPARATUS AND METHOD FOR IMPROVING PERFORMANCE OF SIGMA-DELTA MODULATORS HAVING NON-IDEAL COMPONENTS

(75) Inventor: Gaurav Chandra, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/974,142

(22) Filed: Oct. 11, 2007

(51) Int. Cl.
    H03M 3/00 (2006.01)
(52) U.S. Cl. .................................. 341/143
(58) Field of Classification Search ............. 341/144, 341/155
    See application file for complete search history.

(56) References Cited

U.S. PATENT DOCUMENTS

| | | | |
|---|---|---|---|
| 4,633,425 A * | 12/1986 | Senderowicz | 708/819 |
| 4,896,156 A * | 1/1990 | Garverick | 341/143 |
| 4,920,544 A * | 4/1990 | Endo et al. | 375/243 |
| 5,030,954 A | 7/1991 | Ribner | |
| 7,002,406 B2 * | 2/2006 | Risbo et al. | 330/10 |
| 7,212,136 B2 * | 5/2007 | Roza | 341/76 |
| 7,385,443 B1 * | 6/2008 | Denison | 330/9 |

OTHER PUBLICATIONS

S. Norsworthy, et al, "Delta-Sigma Data Converters, Theory Design and Simulation", IEEE Press, ISBN 0-7803-1045-4, pp. 5-8 and pp. 14-16, (Copyrighted Book).

H.K. Yang, et al, "Double Sampling Delta-Sigma modulators", IEEE Transactions on Circuits & Systems-II, vol. 43, pp. 524-529, Jul. 1996, (Copyrighted Paper).
Burmas, et al, "A Second Order Double Sampled Delta-Sigma Modulator using Additive Error Switching", IEEE Journal of Solid-State Circuits, vol. 31, pp. 284-293, Mar. 1996, (Copyrighted Paper).
C.K. Thanh, et al, A Second Order Double-Sampled Delta-Sigma Modulator Using Individual-Level Averaging, IEEE Journal of Solid-State Circuits, vol. 32, pp. 1269-1273, Aug. 1997, (Copyrighted Paper).
J. Koh, et al, "a 66dB DR 1.2V 1.2mW Single Amplifier Double Sampling 2nd Order Delta-Sigma ADC for WCDMA in 90nm CMOS", Proceedings of the IEEE Symposium on Solid-State Circuits, 2005, (Copyrighted Paper).
B.H. Leung & S. Sutarja, "Multibit Sigma-Delta A/D Converter Incorporating a Novel Class of Dynamic Element Matching Techniques", IEEE Transactions on Circuits and Systems II, vol. 39, No. 1, Jan. 1992, (Copyrighted Paper).

* cited by examiner

*Primary Examiner*—Peguy JeanPierre
(74) *Attorney, Agent, or Firm*—Ronald O. Neerings; Wade James Brady, III; Frederick J. Telecky, Jr.

(57) ABSTRACT

In an apparatus and method for improving performance of a third order, double-sampled, sigma-delta modulator (SDM), a first one of three feedback elements included in a feedback loop of the SDM is selected to complete the feedback loop during a first half-cycle of the clock used for the double-sampling. The first one is restricted from being reselected during a subsequent half-cycle of the clock until the first one is reset. A second one of the three feedback elements is selected during a second half-cycle of the clock that is consecutive to the first half-cycle, the second one being different than the first one. A third one of the three feedback elements is selected during a third half-cycle of the clock that is consecutive to the second half-cycle, the third one being different than the second one.

20 Claims, 5 Drawing Sheets

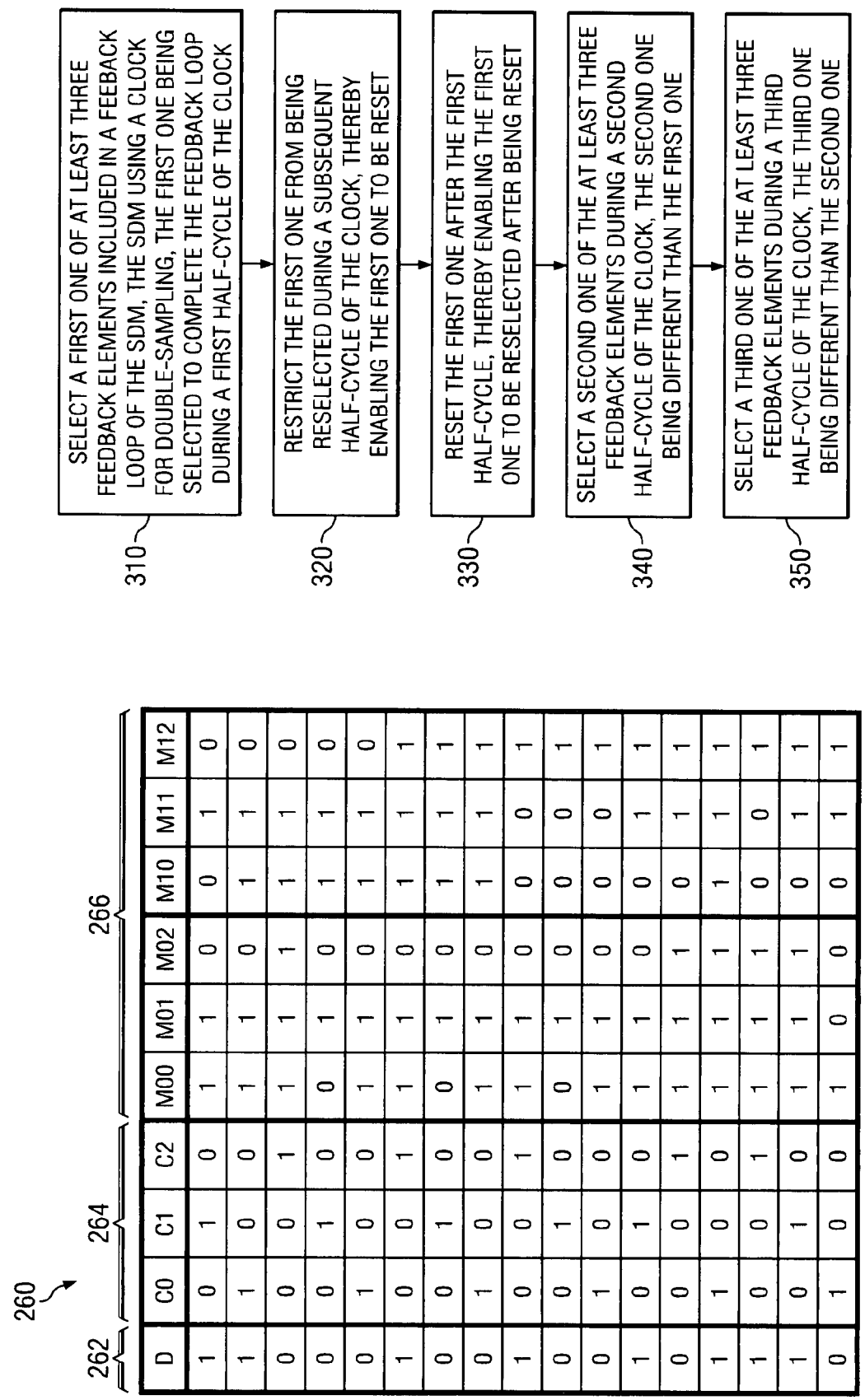

APPARATUS AND METHOD FOR IMPROVING PERFORMANCE OF SIGMA-DELTA MODULATORS HAVING NON-IDEAL COMPONENTS

BACKGROUND

The present disclosure relates generally to an analog-to-digital converter (ADC) used in electronic circuits, and more particularly to a method and an apparatus for improving the performance of ADC's deploying a sigma-delta modulator (SDM).

The SDM is a well known architecture for over-sampled, analog-to-digital data conversion due to its advantages in silicon area, lower power, and the noise-shaping abilities. The SDM may be implemented in either discrete form using switched capacitor circuits or in continuous time, using switched resistors or current sources. It is well known that over-sampling improves SDM performance, e.g., by improving signal-to-noise ratio (SNR). Double sampling is a well known technique that increases the maximum sample rate of a sampled data system without utilizing faster components. The increase in the effective sampling rate is achieved by interleaving two sampling states in the time domain. In one such implementation, the data may be sampled on the rising edge and the falling edge of the same clock, using two different quantizers which feed the output result in a feedback loop to two different digital-to-analog converters (DAC's). The effective sampling rate of a double-sampled SDM is doubled while the sub-components still operate at the more relaxed speed requirements.

A key limitation in a double-sampled SDM, however, arises from a mismatch of feedback elements, e.g., DAC's, included in the feedback path. Any mismatch in the feedback path modulates the digital output data stream generated by the quantizer(s). Since the quantizer output in a sigma-delta modulator has, in addition to the input signal, significant high frequency components, the modulation of mismatch with this high frequency signal causes an in-band error component, which directly manifests itself at the output of the ADC. This phenomenon is often detrimental to the SDM performance. For example, in one simulated application for a traditional SDM, an intentional 1% mismatch in the feedback DAC increased the in-band noise floor considerably, and resulted in a SNR loss of about 10 dB.

A traditional solution for reducing the in-band noise floor utilizes three redundant feedback DAC's that are dynamically chosen in a manner that shapes the mismatch energy out of the band of interest. However, many traditional solutions often rely on the integrity of sampled data collected over a plurality of rising and falling edges of the clock. Non-idealities of electronic components used in a traditional SDM often leads to degradation in the in-band noise floor and may even cause instability in case of low open-loop gain of an operational amplifier. Therefore, a need exists to provide an improved SDM that is capable of handling non-idealities and mismatches in the electronic components used in the SDM. In addition, the improved SDM should provide an improved performance, e.g., as measured in terms of the SNR and the in-band noise floor in the band of interest, compared to the traditional SDM.

SUMMARY

Applicant recognizes that reuse of redundant feedback elements of a second or third order SDM without a reset has the potential to compromise the integrity of sampled data collected over a plurality of rising and falling edges of the clock. That is, consecutive or repeated use of the redundant feedback elements, without clearing out a charge or memory associated with a current sample, may result in a carryover of the charge or memory retained by the redundant feedback element from the current sample to the next sample, thereby contributing to the collection of potentially contaminated samples.

Applicant also recognizes that a traditional SDM which does not deploy an explicit reset often relies on a virtual ground created by an operational amplifier (op-amp) during the feedback phase. In a switched capacitor implementation of the redundant feedback elements, a bottom plate of the capacitor is typically not reset to a physical ground but remains connected to the op-amp input terminal which is only an approximate ground. In the case when the op-amp has finite gain and bandwidth, or offsets, this terminal retains the memory of the previous sample. Applicant further recognizes that such non-idealities and mismatches in the feedback elements of the SDM lead to the degradation in noise floor and even instability in case of low open-loop gain of the op-amp. Traditional SDM designs may also be highly sensitive to op-amp gain non-linearity and the offset, leading to a degraded performance. Therefore, it would be desirable to provide an improved SDM for performing analog-to-digital conversion. Accordingly, it would be desirable to provide a method and apparatus for improving performance of a SDM, absent the disadvantages found in the prior methods discussed above.

The foregoing needs are addressed by the teachings of the present disclosure, which relates to an apparatus and method for converting an analog signal to a digital signal using an improved SDM. According to one embodiment, in an apparatus and method for improving performance of a double-sampled, sigma-delta modulator (SDM), a first one of three feedback elements included in a feedback loop of the SDM is selected to complete the feedback loop during a first half-cycle of the clock used for the double-sampling. The first one is restricted from being reselected during a subsequent half-cycle of the clock until the first one is reset. A second one of the three feedback elements is selected during a second half-cycle of the clock that is consecutive to the first half-cycle, the second one being different than the first one. A third one of the three feedback elements is selected during a third half-cycle of the clock that is consecutive to the second half-cycle, the third one being different than the second one.

In one aspect of the disclosure, a sigma-delta modulator (SDM) includes a summer operable to sum an analog input signal and a feedback signal and provide a summer output signal, a loop filter to loop filter selective frequencies of the summer output signal, a quantizer operable to double-sample the summer output signal with a clock, and at least three feedback elements coupled in parallel to provide feedback. The quantizer provides a digital output data stream for the analog input and each one of the at least three feedback elements is operable to convert the digital output data stream into the feedback signal. The SDM includes a feedback path controller operable to provide the digital output data stream to a selected one of the at least three feedback elements. The feedback path controller includes an input to receive the digital output data stream during the plurality of half cycles of the clock. A three-way switch selects the feedback path from the input to one of three feedback elements of the SDM. Each one of the three feedback elements is identified by a corresponding identifier. A logic block controls the operation of the three-way switch. The logic block includes a memory to store a previous identifier corresponding to a first one of the three feedback elements selected during a previous half cycle of the clock and a selector to compare the previous identifier and a current identifier and make a selection. The current identifier corresponds to a second one of the three feedback elements selected during a current half cycle, the current half cycle being consecutive in time to the previous half cycle. The selector selects the second one in response to current identifier being different than the previous identifier.

In another aspect of the disclosure, a feedback path controller for a sigma-delta modulator (SDM) includes a clock operable to generate a plurality of half cycles to double-sample the SDM. An input is coupled to receive a digital output data stream provided by the SDM, the digital output data stream being received during the plurality of half cycles of the clock. A three-way switch selects the feedback path from the input to one of three feedback elements of the SDM. Each one of the three feedback elements is identified by a corresponding identifier. A logic block controls the operation of the three-way switch. The logic block includes a memory to store a previous identifier corresponding to a first one of the three feedback elements selected during a previous half cycle of the clock and a selector to compare the previous identifier and a current identifier and make a selection. The current identifier corresponds to a second one of the three feedback elements selected during a current half cycle, the current half cycle being consecutive in time to the previous half cycle. The selector selects the second one in response to current identifier being different than the previous identifier.

Several advantages are achieved by the method and apparatus according to the illustrative embodiments presented herein. The embodiments provide an improved SDM that advantageously retains integrity of sampled data collected over a plurality of rising and falling edges of a clock by resetting the feedback elements before their subsequent use. The hard reset of each selected feedback element after each use advantageously eliminates any potential for carryover of a charge or memory between samples. A selection technique based on a 1-bit counter to count each instance of a selection of the feedback elements of an improved SDM advantageously improves the SNR by about 12 dB compared to a traditional SDM without a counter when there is a 1% mismatch present in both the SDM's. Other selection techniques based on algorithms such as a remember-the-last-but-one (RLBO) also provide similar improvements in SDM performance. Thus, the improved selection technique of the feedback elements advantageously handles non-idealities and mismatches in the electronic components used in the SDM and delivers improved performance by improving SNR and lowering in-band noise floor compared to the traditional SDM.

BRIEF DESCRIPTION OF THE DRAWINGS

FIG. 2C illustrates in a tabular form a counter based algorithm to achieve desired performance of the SDM 100 described with reference to FIGS. 1A, 1B, 1C, 2A, and 2B according to an embodiment;

FIG. 3 is a flow chart illustrating a method for selecting a feedback element of a sigma-delta modulator (SDM), according to an embodiment.

DETAILED DESCRIPTION

Figure 1A:
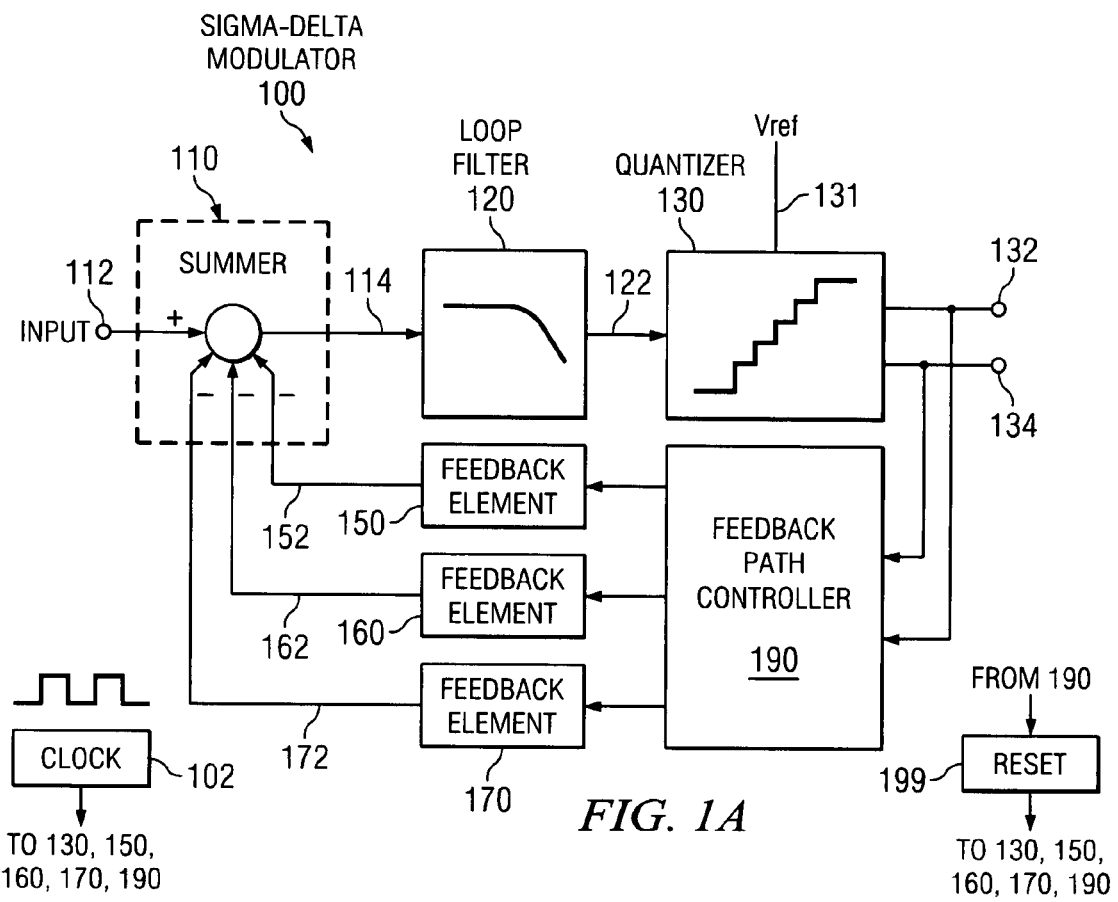
FIG. 1A illustrates a block diagram of an improved sigma-delta modulator (SDM), according an embodiment.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, sub-assemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

As described earlier, a traditional solution for reducing the in-band noise floor utilizes three redundant feedback DAC's that are dynamically chosen in a manner that shapes the mismatch energy out of the band of interest. However, many of these traditional solutions often rely on the integrity of sampled data collected over a plurality of rising and falling edges of the clock. The reuse of redundant feedback elements without a hard reset has the potential to compromise the integrity of sampled data. The non-idealities of electronic components used in a traditional SDM often leads to degradation in the in-band noise floor and may even cause instability in case of low open-loop gain of an operational amplifier. Therefore, a need exists to provide a method and apparatus for an SDM having an improved performance. This problem may be addressed by an improved apparatus and method for selecting a feedback element of a SDM.

According to one embodiment, in an apparatus and method for improving performance of a third order, double-sampled, sigma-delta modulator (SDM), a first one of three feedback elements included in a feedback loop of the SDM is selected to complete the feedback loop during a first half-cycle of the clock used for the double-sampling. The first one is restricted from being reselected during a subsequent half-cycle of the clock until the first one is reset. A second one of the three feedback elements is selected during a second half-cycle of the clock that is consecutive to the first half-cycle, the second one being different than the first one. A third one of the three feedback elements is selected during a third half-cycle of the clock that is consecutive to the second half-cycle, the third one being different than the second one.

The following terminology may be useful in understanding the present disclosure. It is to be understood that the terminology described herein is for the purpose of description and should not be regarded as limiting.

Semiconductor Device—A semiconductor device is an electronic component that utilizes electronic properties of semiconductor materials to perform a desired function. A semiconductor device may be manufactured as a single discrete device or as one or more integrated circuits (ICs) packaged into a module.

Configuration—Describes a set up of an element, a circuit, a package, an electronic device, and similar other, and refers to a process for setting, defining, or selecting particular properties, parameters, or attributes of the device prior to its use or operation. Some configuration attributes may be selected to have a default value. For example, a SDM may be configured to have three redundant feedback elements in a feedback loop.

An apparatus in the form of an improved SDM that is operable to deliver an improved performance compared to a traditional SDM is described with reference to FIGS. 1A, and 1B. Various noise-shaping algorithms to achieve desired improvement in the performance of the improved SDM are described with reference to FIGS. 2A, 2B, 2C, 2D and 2E. A method for selecting a feedback element of a sigma-delta modulator (SDM) is described with reference to FIG. 3.

FIG. 1A illustrates a block diagram of an improved sigma-delta modulator (SDM) 100, according to an embodiment. The SDM 100 is an electronic circuit that utilizes various function blocks arranged in a feedback loop to convert an analog signal to a digital output using over-sampled data. The SDM 100 uses two edges of a clock 102 to double-sample an analog input signal received at an input 112 and perform a coarse quantization to provide a first digital output signal corresponding to a first edge of the clock 102 at a first output 132 and a second digital output signal corresponding to a second edge of the clock 102 at a second output 134. In a particular embodiment, the clock 102 provides two non-overlapping phases (or half-cycles), e.g., a first phase and a second phase, corresponding to the two edges. The two non-overlapping phases (or half-cycles) are repeated thereafter as a first half-cycle, a second half-cycle, a third half-cycle, and so on. The first and second digital output signals may be in the form of a bit stream. It is understood that the first digital output and the second digital output signals may be combined into a single digital output by interleaving the two sampled data in the time domain. The double-sampling advantageously doubles the effective frequency of the clock 102, thereby making it much higher than the Nyquist rate without utilizing faster components. By using a combination of feedback and integration, the resulting quantization noise is shifted to a higher frequency range that is much greater compared to the band of interest.

In the depicted embodiment, the improved SDM 100 includes a summer 110, a loop filter 120, a quantizer 130, three feedback elements 150, 160 and 170, and a feedback path controller 190. The summer 110 is operable to sum the analog input signal received at the input 112 and feedback signals 152, 162, and 172 corresponding to each one of the feedback elements 150, 160 and 170 and provide a summer output signal 114. The summer output signal 114 is indicative of an error between the output signal and the analog input received by the SDM 100. In a particular embodiment, the summer 110 may be implemented as one of the terminals of a differential operational amplifier (op-amp). In an exemplary non-depicted embodiment, a higher order SDM, e.g., having a higher order loop filter, may be implemented to further improve SNR compared to a lower order SDM.

The summer output signal 114 is filtered by the loop filter 120 to provide a loop filtered output signal 122. By integrating the error voltage signal over time, the loop filter 120 becomes a low-pass filter to the analog input signal and becomes a noise-shaping high-pass filter to the quantization noise. Thus, the loop filter 120, which also acts an integrator, shifts the quantization noise to higher frequencies. The loop filtered output signal 122, which includes selective (or in-band) frequencies, is provided to the quantizer 130. The quantizer 130 is operable to sample the loop filtered output signal 122 during half cycles corresponding to the leading and trailing edges of the clock 102. The sampled signal is quantized or digitized by the quantizer 130 by generating the first and second digital outputs, each in the form of a bit stream consisting of a time sequence of logical highs and logical lows. The density of logical highs and lows included in the digital output bit stream is proportional to the analog input signal. That is, for an increasing input signal the quantizer 130 generates a greater number of logical highs and for a decreasing input signal the quantizer 130 generates a greater number of logical lows.

In a particular embodiment, the quantizer 130 is a 1-digit or a 2-digit comparator, which is operable to compare the sampled and loop filtered output signal 122 to a reference voltage Vref 131 during the leading and trailing edges of the clock 102 and generate a logical high or a logical low based on each comparison. A 1-bit quantizer generates two output codes (or output states), e.g., D1 and D0, and a 2-bit quantizer generates four output codes (or output states), e.g., D0, D1, D2 and D3. The D1 and D0 codes respectively correspond to the logical high and logical low levels. As described earlier, the quantizer 130 generates the logical high or the logical low as the first digital output signal corresponding to the first edge of the clock 102 at the first output 132 and as the second digital output signal corresponding to the second edge of the clock 102 at the second output 134.

The feedback path controller 190 is coupled to the first output 132 and the second output 134 to respectively receive the first digital output and the second digital output signals. The feedback path controller 190 is operable to direct the first digital output and the second digital output signals to a selected one of the three feedback elements 150, 160 and 170. The selected one of the three feedback elements 150, 160 and 170 converts either of the digital output signals to an analog feedback signal, with each one of the feedback elements 150, 160 and 170 operable to generate a corresponding one of the feedback signals 152, 162, and 172. That is, the two digital outputs are de-multiplexed into the feedback elements 150, 160 and 170. The corresponding one of the feedback signals 152, 162, and 172 is provided to the summer 110, thereby completing the feedback loop. It is understood that, although the SDM 100 is illustrated to include the three feedback elements 150, 160 and 170, the SDM 100 may be configured to include n feedback elements, where n is an integer.

The selection of a particular one of the three feedback elements 150, 160 and 170 by the feedback path controller 190 is advantageously performed in accordance with desirable constraints or selection criteria, e.g., no feedback element is repeatedly selected without a hard reset between each use, to ensure the integrity of sampled data collected over a plurality of rising and falling edges of the clock. As another example, any one of the three feedback elements 150, 160 and 170 is restricted by the feedback controller 190 from processing both the digital output signals in a consecutive manner. Additional detail of the feedback path controller 190 is described with reference to FIG. 1B. Additional detail of the constraints or selection criteria is described with reference to FIGS. 2A, 2B, 2C, 2D and 2E.

Referring back to FIG. 1A, the feedback loop maintains the average output of the loop filter 120 near the voltage reference level Vref 131 of the quantizer 130. In a particular embodiment, each one of the three feedback elements 150, 160 and 170 is a switch that generates the analog feedback signal from a positive (logic high) or negative (logic low) voltage levels used as a reference. In a particular embodiment, each one of the three feedback elements 150, 160 and 170 is implemented as a digital-to-analog converter (DAC). Additional detail of a feedback element implemented as a switched capacitor circuit is described with reference to FIG. 1C.

Referring back to FIG. 1A, in the depicted embodiment, the three feedback elements 150, 160 and 170 are non-ideal, and therefore mismatched. That is, elements such as such as capacitors, resistors, transistors, current sources, and similar others (not shown), which may be used in the fabrication of the three feedback elements 150, 160 and 170 are mismatched due to non-idealities such as manufacturing process variations, imperfections in materials used, changes in temperature, humidity, degradation, and similar other factors, thereby causing non-linearity in the feedback path, which manifests itself as distortion and noise at an output of the SDM 100.

Figure 1B:
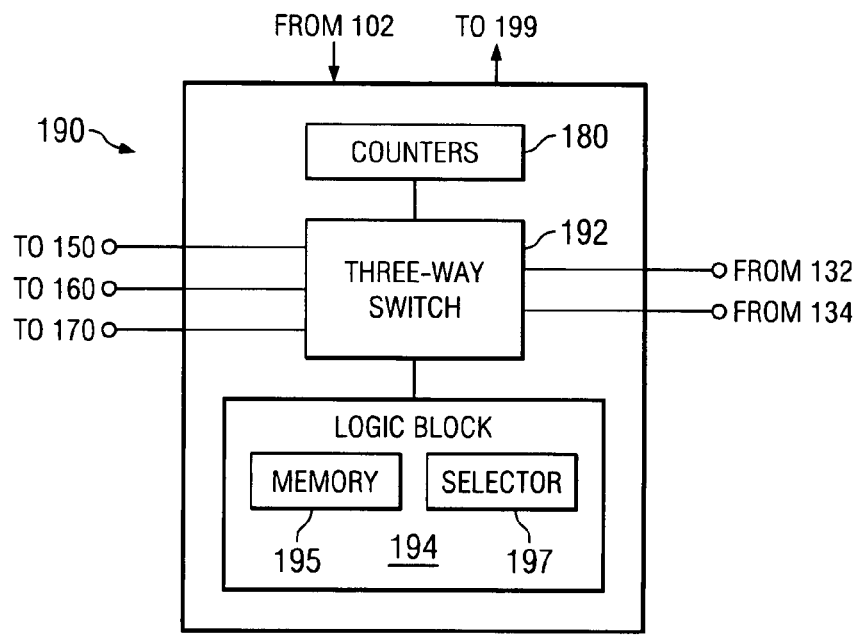
FIG. 1B illustrates a block diagram of a feedback path controller described with reference to FIG. 1A, according an embodiment.

FIG. 1B illustrates a block diagram of the feedback path controller 190 described with reference to FIG. 1A, according an embodiment. In the depicted embodiment, the feedback path controller 190 includes inputs that are respectively coupled to the first output 132 and the second output 134 to receive the first digital output and the second digital output. As described earlier, it is understood that in a particular embodiment, the inputs may be combined into one and the first and second outputs 132 and 134 may be combined into one by interleaving the digital output data streams in the time domain. The feedback path controller 190 includes a three-way switch 192 that couples the inputs to a selectable one of the three feedback elements 150, 160 and 170. In a particular embodiment, each one of the three feedback elements 150, 160 and 170 that are mismatched is identified by a corresponding identifier, e.g., DAC_1, DAC_2, DAC_3, and similar others.

The three-way switch 192 is controlled by a logic block 194. That is, the logic block 194 is operable to select a position of the three-way switch 192, thereby enabling the feedback path from the inputs to a selected one of three feedback elements 150, 160 and 170. The logic block 194 includes logic or circuitry to execute desirable constraints or selection criteria, e.g., no feedback element is repeatedly selected without a hard reset between each use, to ensure the integrity of sampled data collected over a plurality of rising and falling edges of the clock 102. In a particular embodiment, the logic block 194 may be implemented as an electronic circuit using discrete components or may be implemented as a finite state machine (FSM) using a field programmable gate array (FPGA).

In a particular embodiment, the logic block 194 includes a memory 195 and a selector 197. The memory 195 is operable to store a previous identifier corresponding to a first one of the three feedback elements 150, 160 and 170 selected during a previous half cycle of the clock 102. The selector 197 is operable to compare the previous identifier stored in the memory 195 and a current identifier corresponding to a second one of the three feedback elements 150, 160 and 170 selected during a current half cycle of the clock 102. The current half cycle is consecutive in time to the previous half cycle. In response to current identifier being different than the previous identifier, the selector 197 selects the second one of the three feedback elements 150, 160 and 170 by enabling the three-way switch 192 to couple the inputs to the second one of three feedback elements 150, 160 and 170. The first one of the three feedback elements 150, 160 and 170 is reset prior to its next selection, the reset being provided by a reset circuit 199 triggered by the logic block 194. The reset advantageously clears out any charge or memory associated with a previous sample acquired during the previous half cycle.

In a particular embodiment, the feedback path controller 190 includes six counters 180 corresponding to each one of two output codes (or state) (e.g., logic high and logic low) and each one of the three feedback elements 150, 160 and 170. Each one of the counters 180 is operable to count each instance of a selection of the three feedback elements 150, 160 and 170 corresponding to each output code. In a particular embodiment, each one of the counters 180 may be implemented as a flip-flop. In an embodiment, the selection criteria for selecting a particular one of the three feedback elements 150, 160 and 170 is based on a numerical count value of each one of the counters 180.

Figure 1C:
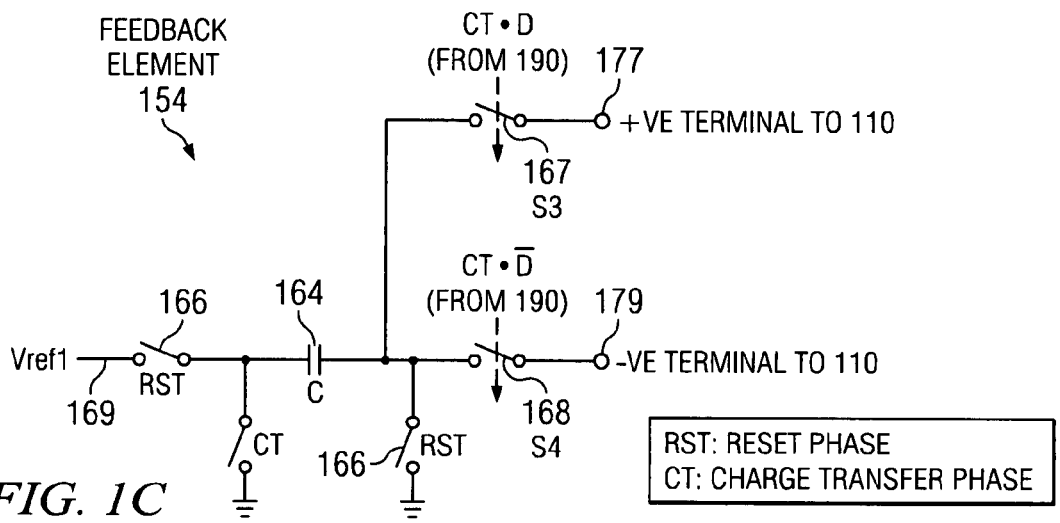
FIG. 1C illustrates a circuit diagram of a feedback element described with reference to FIG. 1A, according to an embodiment.

FIG. 1C illustrates a circuit diagram of a feedback element 154, according to an embodiment. Each one of the three feedback elements 150, 160 and 170 described with reference to FIG. 1A may be implemented as the feedback element 154. In the depicted embodiment, the feedback element 154 is a 1-bit DAC that is implemented using a C capacitor 164 and a plurality of switches that are controlled by the logic block 194, the reset circuit 199, and by the clock 102. A voltage reference Vref1 169, which is in accordance with a high and low logical state of the 1-bit quantizer, is coupled to the capacitor C 164 and a ground through RST switches 166. The RST switches 166 are controlled during a reset phase by a reset signal received from the reset circuit 199. The reset phase advantageously erases any previous memory (charge) on the capacitor C 164.

During a charge transfer (CT) phase, a charge is transferred from the capacitor C 164 to one of a positive terminal 177 or a negative terminal 179 associated with each of the feedback signals 152, 162, and 172. That is, based on the polarity of the output signal D, where D is the output signal at first output 132 or the second output 134 of the quantizer, the charge stored on the capacitor C 164 is transferred to either the positive terminal 177 or the negative terminal 179 of a circuit (not shown). Switch S3 167 is controlled by D and a CT signal. The CT signal is provided by the feedback path controller 190 in accordance with the desirable constraints or selection criteria. Switch S4 168 is controlled by (D bar) and the CT signal. The capacitor C 164 is coupled to the ground through a S1 switch 165 controlled by the CT signal. In an exemplary, non-depicted embodiment, the circuit having the positive terminal 177 and the negative terminal 179 may be implemented as an op-amp. For an op-amp implementation, a voltage at the output of the op-amp may be computed as Gain*Vref1, wherein Gain is the op-amp gain. The output of the op-amp may be provided as one of the feedback signals 152, 162, and 172.

Figure 2A:
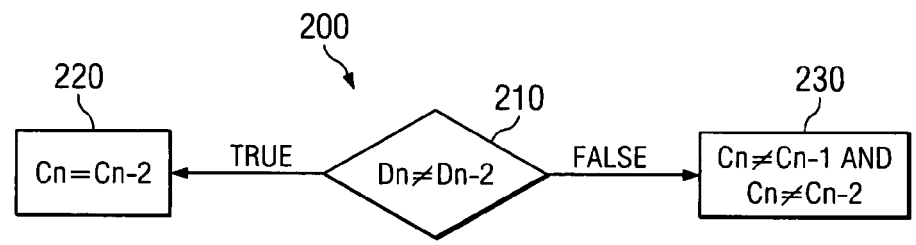
FIG. 2A illustrates a flow chart of a remember-the-last-but-one (RLBO) algorithm to achieve desired performance of the SDM described with reference to FIGS. 1B, and 1C according to an embodiment.

FIG. 2A illustrates a flow chart 200 of a remember-the-last-but-one (RLBO) algorithm to achieve desired performance of the SDM 100 described with reference to FIG. 1A, according to an embodiment. In a particular embodiment, the quantizer 130 is 1-bit and uses double-sampling. Dn is an output (equal to a logical high or a logical low) of the quantizer 130 at the $n^{th}$ sampling instant and Cn is an identifier of the feedback element used in the $n^{th}$ sampling phase. The value of Cn may be equal to a selectable one of C1, C2 or C3 during the $n^{th}$ sampling phase, where C1, C2 or C3 respectively represent the identifiers for the three feedback elements 150, 160 and 170. At step 210, a comparison is made whether Dn is not equal to Dn−2. At step 220, in response to determining that (Dn is not equal to Dn−2) is true, a selection of current feedback element is the same as the feedback element used 2 phases before current phase. At step 230, in response to determining that (Dn is not equal to Dn−2) is false, a selection of current feedback element is different than the feedback element used during the previous phase and during 2 phases before the current phase.

The selection criteria in accordance with the RLBO algorithm may also be stated as Rule 100:

If (Dn is not equal to Dn−2) then select Cn=Cn−2, else select Cn=not (Cn−1 or Cn−2), End . . . Rule 100

For example, if D3 is not equal to D1 and feedback element C1 was used during the first phase and feedback element C2 was used during the second phase, then the selection of the feedback element for the current phase (third phase) is the same as used during the first sampling phase, e.g., C1. If D3 is equal to D1, then the selection of the feedback element for the current phase (third phase) is different than C1 and C2, e.g., C3. The RLBO algorithm inherently ensures that Cn is not equal to Cn−1.

Figure 2E:
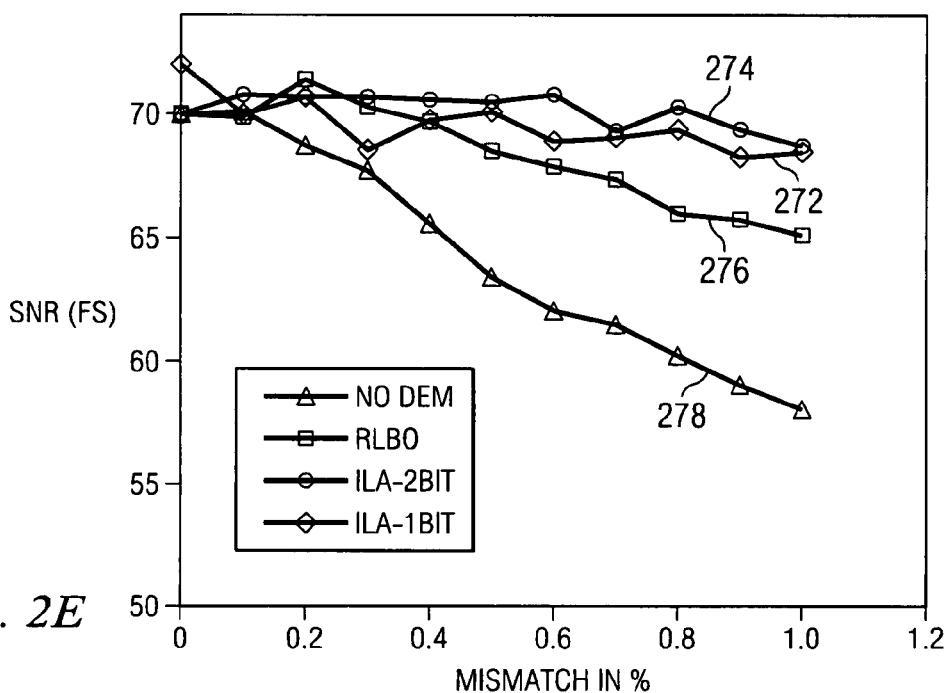
FIG. 2E illustrates in a graphical form an improvement in performance of a RLBO, 1-bit counter, and a 2-bit counter based algorithm included in the SDM 100 described with reference to FIGS. 1A, 1B, 1C, 2A, 2B, 2C, and 2D compared to a traditional SDM, according to an embodiment.
Figure 2B:
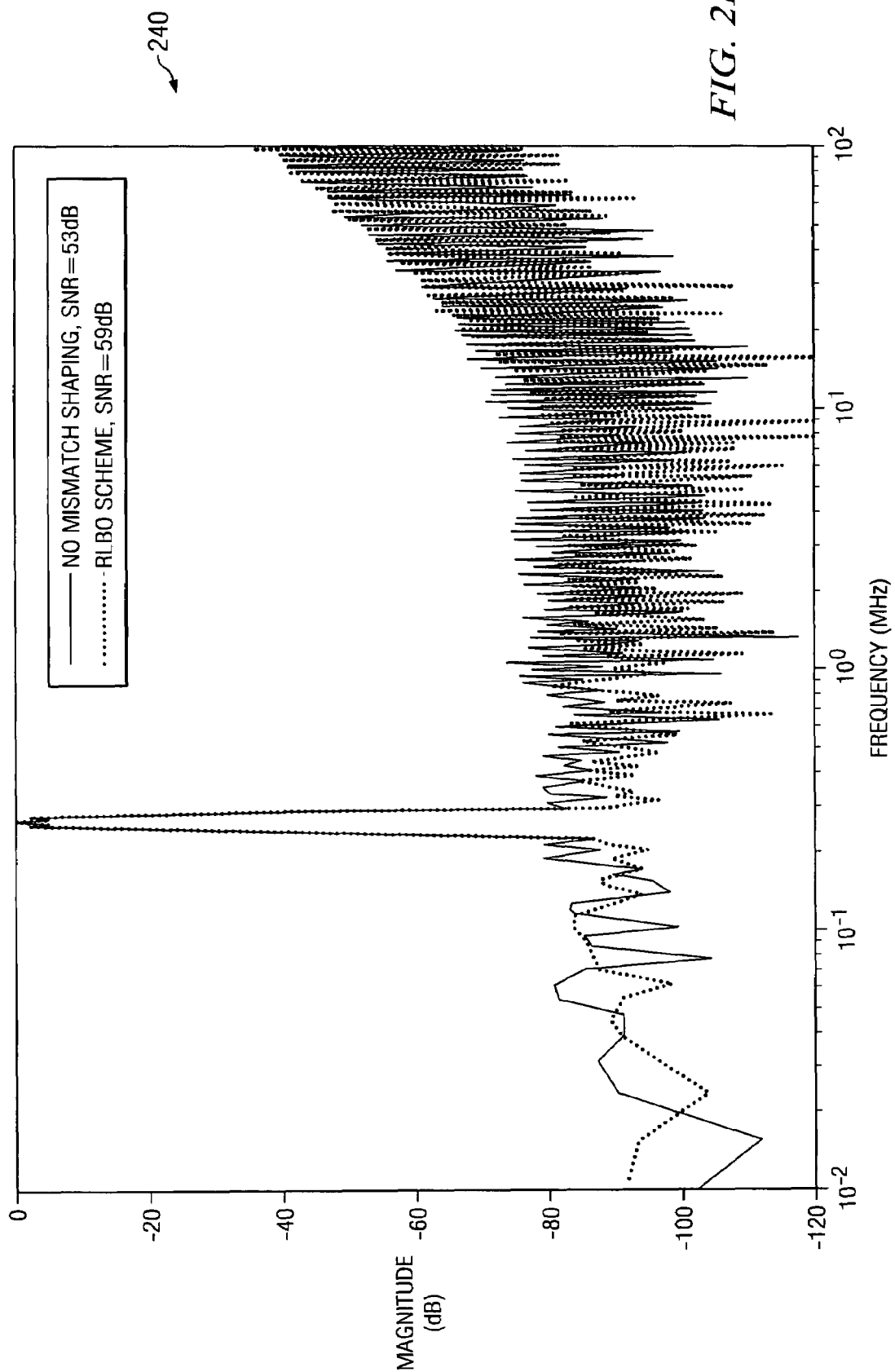
FIG. 2B illustrates in a graphical form an improvement in performance of the RLBO algorithm included in the SDM 100 described with reference to FIGS. 1A, 1B, 1C, and 2A compared to a traditional SDM, according to an embodiment.

FIG. 2B illustrates in a graphical form an improvement in performance of the RLBO algorithm based SDM 100 described with reference to FIG. 2A compared to a traditional SDM, according to an embodiment. A graph 240 shows a frequency spectrum of the output of the SDM 100 with the RLBO algorithm using simulation tools. The graph 240 shows a distribution of power spectral density (measured in dB along Y-axis) as a function of frequency (Mhz along X-axis). The graph 240 illustrates that for the bandwidth of interest, an improvement of approximately 6 dB is obtained compared to a traditional SDM that does not include a mismatch shaping device.

FIG. 2C illustrates in a tabular form a counter based algorithm to achieve desired performance of the SDM 100 described with reference to FIG. 1A, 1B, 1C, 2A and 2B according to an embodiment. As described earlier, each one of the counters 180 described with reference to FIG. 1A is operable to count each instance of a selection of the three feedback elements 150, 160 and 170 for each output code. The counter based selection algorithm illustrated in a table 260 advantageously utilizes two sets of constraints, including a first constraint that substantially equalizes the selection instances of each feedback element over a desired number of half-cycles and a second constraint that restricts a feedback element from being selected in consecutive half-cycles of the clock 102. In an embodiment, the selection criteria for selecting a particular one of the three feedback elements 150, 160 and 170 is based on a value count of a 1-bit counter for each of the counters 180. It is understood that a multi-bit counter may also be used.

The table 260 illustrates the values of the output (column D 262), each instance of the selection of a feedback element (columns C0, C1, and C2 264), and 6 count values stored in the counters 180 (M00, M01, M02, M10, M11 and M12 266) for each output. Each row of the table indicates the respective values during a half-cycle of the clock 102. In accordance with the algorithm, no feedback element (columns C0, C1, and C2 264) is used in consecutive rows. The counters 180 (M00, M01, M02, M10, M11 and M12 266) are reset when a full count of (1, 1, 1) for (M00, M01, M02) or (M10, M1 and M12) is reached, e.g., in row 4 adding 1 to (M00, M01, M02) valued at (1, 1, 1) for a previous half-cycle, results in having a new count of (0, 1, 0). The table 260 illustrates that over a period of 17 half-cycles of the clock 102, feedback elements (columns C0, C1, and C2 264) have been selected 6, 6, and 5 number of times respectively, thereby indicating a substantially equal selection measured over a desired number of half-cycles.

Figure 2D:
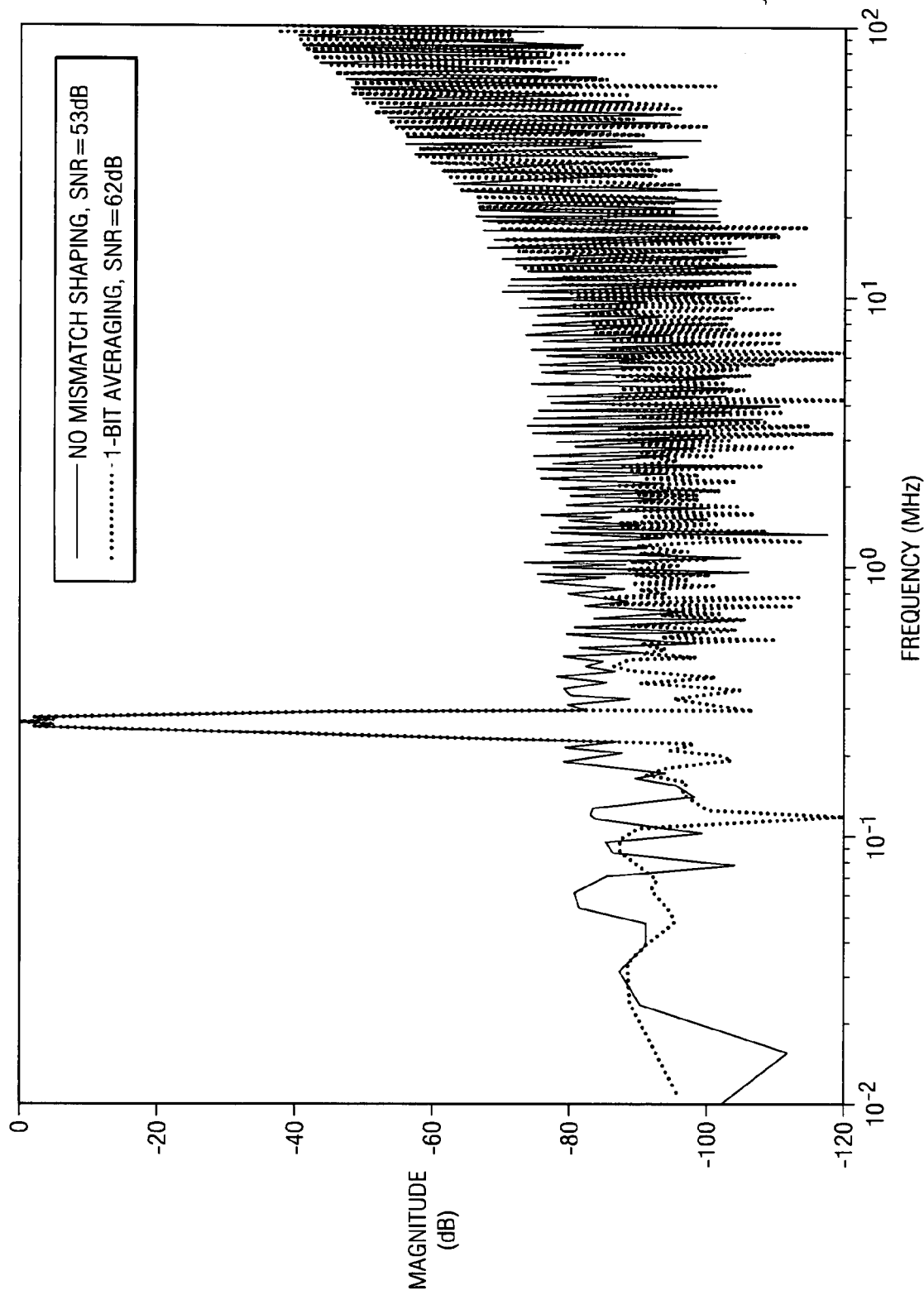
FIG. 2D illustrates in a graphical form an improvement in performance of the counter based algorithm included in the SDM 100 described with reference to FIG. 1A, 1B, 1C, 2A, 2B, and 2C compared to a traditional SDM, according to an embodiment.

FIG. 2D illustrates in a graphical form an improvement in performance of the counter based algorithm described with reference to FIG. 2C compared to a traditional SDM, according to an embodiment. A graph 250 shows a frequency spectrum of the output of the SDM 100 with the counter based algorithm using simulation tools. The graph 250 shows a distribution of power spectral density (measured in dB along Y-axis) as a function of frequency (Mhz along X-axis). The graph 250 illustrates that for the bandwidth of interest, an improvement of approximately 8 to 10 dB is obtained compared to a traditional SDM that does not include a mismatch shaping device.

FIG. 2E illustrates in a graphical form an improvement in performance of a RLBO, 1-bit counter, and a 2-bit counter based algorithm included in the SDM 100 described with reference to FIGS. 1A, 1B, 1C, 2A, 2B, 2C, and 2D compared to a traditional SDM, according to an embodiment. At a 1% mismatch level between the feedback elements, graph 272 for a 1-bit or graph 274 for a 2-bit counter based algorithm for making selection of a feedback element illustrate a 10 dB improvement in the SNR compared to a traditional SDM (graph 278). Similarly, graph 276 for a RLBO based algorithm illustrates an 8 dB improvement in the SNR compared to the traditional SDM (graph 278) that does not include a mismatch shaping device.

FIG. 3 is a flow chart illustrating a method for selecting a feedback element of a sigma-delta modulator (SDM), according to an embodiment. In a particular embodiment, the method is used to select one of the at least three feedback elements included in the SDM 100 described with reference to FIGS. 1A, 1B, 1C, 2A, 2B, 2C, 2D, and 2E. At step 310, a first one of at least three feedback elements included in a feedback loop of the SDM is selected, the SDM using a clock for double-sampling. The first one is selected to complete the feedback loop during a first half-cycle of the clock. At step 320, the first one is restricted from being reselected during a subsequent half-cycle of the clock, thereby enabling the first one to be reset. At step 330, the first one is reset after the first half-cycle, thereby enabling the first one to be reselected after being reset. At step 340, a second one of the at least three feedback elements is selected during a second half-cycle of the clock, the second one being different than the first one. At step 350, a third one of the at least three feedback elements is selected during a third half-cycle of the clock, the third one being different than the second one. In an embodiment, the third one may be the same as the first one provided the first one has been reset.

Various steps described above may be added, omitted, combined, altered, or performed in different orders. For example, step 340 may be expanded to include additional steps for comparing counters or comparing identifiers in order to select the second one.

Several advantages are achieved by the method and apparatus according to the illustrative embodiments presented herein. The embodiments provide an improved SDM that advantageously retains integrity of sampled data collected over a plurality of rising and falling edges of a clock by resetting the feedback elements before their subsequent use. The hard reset of each selected feedback element after each use advantageously eliminates any potential for carryover of a charge or memory between samples. A selection technique based on a 1-bit counter to count each instance of a selection of the feedback elements of an improved SDM advantageously improves the SNR by about 12 dB compared to a traditional SDM without a counter when there is a 1% mismatch present in both the SDM's. Other selection techniques based on algorithms such as RLBO also provide similar improvements in SDM performance. Thus, the improved selection technique of the feedback elements advantageously handles non-idealities and mismatches in the electronic components used in the SDM and delivers improved performance by improving SNR and lowering in-band noise floor compared to the traditional SDM.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of using switched capacitor circuits, those of ordinary skill in the art will appreciate that the apparatus and methods disclosed herein are capable of being implemented as semiconductor devices including integrated circuit chips. As another example, the various selection techniques described with reference to the improved SDM may be implemented as a finite state machine (FSM) using a field programmable gate array (FPGA). As yet another example, while certain aspects of the present disclosure have been described in the context of using a 1-bit quantizer and a 1-bit DAC, those of ordinary skill in the art will appreciate that the apparatus and methods disclosed herein are capable of being implemented in multi-bit SDM applications.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for selecting a feedback element of a sigma-delta modulator (SDM), the method comprising:

selecting a first one of at least three feedback elements included in a feedback loop of the SDM, wherein the SDM is double-sampled by a clock, wherein the first one is selected to complete the feedback loop during a first half-cycle of the clock; and restricting the first one from being reselected during a subsequent half-cycle of the clock, thereby enabling the first one to be reset.

2. The method of claim 1 further comprising:

resetting the first one after the first half-cycle, thereby enabling the first one to be reselectable after the reset.

3. The method of claim 2, wherein the resetting includes erasing a memory of a sample stored by the first one, the sample being stored during the first half-cycle of the clock.

4. The method of claim 3, wherein the memory of the sample is stored as a charge on a capacitor included in the SDM.

5. The method of claim 1, further comprising:

selecting a second one of the three feedback elements during a second half-cycle of the clock, the second one being different than the first one; and selecting a third one of the three feedback elements during a third half-cycle of the clock, the third one being different than the second one.

6. The method of claim 5, wherein the third one is the first one after the first one is reset.

7. The method of claim 5, wherein the third one is different than the first one.

8. The method of claim 5, wherein the second one is selected in accordance with a counter, wherein the counter is assignable to each one of the three feedback elements selectable for each output code of the SDM, wherein the counter is operable to count each instance of a selection of the three feedback elements corresponding to each one of the output code.

9. The method of claim 8, wherein the counter corresponding to the second one has a lower count compared to the counter corresponding to the third one for a particular output code.

10. The method of claim 8, wherein the counter is configured to include at most 2 bits.

11. The method of claim 8, wherein an average value of the count corresponding to each one of the three feedback elements selectable for each output code of the SDM and measured over a configurable number of half-cycles of the clock is substantially equal.

12. The method of claim 5, wherein selecting the third one of the three feedback element includes:

comparing a third output value of an output of the SDM corresponding to the third half-cycle of the clock and a first output value of the output of the SDM corresponding to the first half-cycle of the clock; and selecting the third one to be same as the first one in response to the third output value being unequal to the first output value, wherein the first one is reselectable after being reset.

13. The method of claim 12, wherein selecting the third one of the three feedback element further includes:

selecting the third one to be different than the first one and the second one in response to the third output value being equal to the first output value.

14. The method of claim 1, wherein each one of the three feedback elements is a capacitor switched digital-to-analog converter (DAC), wherein the capacitor included in each one of the three feedback elements is mismatched.

15. A feedback path controller for a sigma-delta modulator (SDM), the feedback path controller comprising:

a clock operable to provide a plurality of half cycles to double-sample the SDM;

an input to receive a digital output data stream provided by the SDM, wherein the digital output data stream is received during the plurality of half cycles of the clock;

a three-way switch to select the feedback path from the input to one of at least three feedback elements of the SDM, wherein each one of the at least three feedback elements is identified by a corresponding identifier; and a logic block to control the three-way switch, wherein the logic block includes:

a memory to store a previous identifier corresponding to a first one of the at least three feedback elements selected during a previous half cycle of the clock;

a selector to compare the previous identifier and a current identifier, wherein the current identifier corresponds to a second one of the at least three feedback elements selected during a current half cycle, the current half cycle being consecutive in time to the previous half cycle, wherein the selector selects the second one in response to current identifier being different than the previous identifier.

16. The feedback path controller of claim 15, further comprising:

a reset circuit to reset each selected one the at least three feedback elements prior to being reselected.

17. The feedback path controller of claim 15, further comprising:

a counter corresponding to each one of the three feedback elements selectable for feedback elements corresponding to each one of the output code, wherein a number of the output code corresponds to a number of bits in a quantizer of the SDM, the quantizer providing the digital output data stream.

18. The feedback path controller of claim 17, wherein the selector is operable to select the counter corresponding to one of the three feedback elements having a lower count compared to another counter for a particular output code.

19. The feedback path controller of claim 15, wherein each one of the three feedback elements is a switched capacitor digital-to-analog converter (DAC).

20. A sigma-delta modulator (SDM) comprising:

a summer operable to sum an analog input signal and a feedback signal and provide a summer output signal;

a loop filter to filter selective frequencies of the summer output signal;

a quantizer operable to double-sample the summer output signal having the selective frequencies with a clock, the quantizer providing a digital output data stream for the analog input;

at least three feedback elements coupled in parallel to provide feedback, wherein each one of the at least three feedback elements is operable to convert the digital output data stream into the feedback signal; and a feedback path controller operable to provide the digital output data stream to a selected one of the at least three feedback elements, wherein the feedback path controller includes:

an input to receive the digital output data stream, wherein the digital output data stream is received during a plurality of half cycles of the clock;

a three-way switch to couple the input to one of the at least three feedback elements, wherein each one of the three feedback elements is identified by a corresponding identifier;

a logic block to control the three-way switch, wherein the logic block includes:

a memory to store a previous identifier corresponding to a first one of the at least three feedback elements selected during a previous half cycle of the clock;

a selector to compare the previous identifier and a current identifier, wherein the current identifier corresponds to a second one of the at least three feedback elements selected during a current half cycle, the current half cycle being consecutive in time to the previous half cycle, wherein the selector selects the second one in response to current identifier being different than the previous identifier.

* * * * *